United States Patent
Yoon

(10) Patent No.: US 7,359,682 B2
(45) Date of Patent: Apr. 15, 2008

(54) APPARATUS AND METHOD FOR IMPROVING EFFICIENCY OF POWER AMPLIFIER OPERATING UNDER LARGE PEAK-TO-AVERAGE POWER RATIO

(75) Inventor: Hyun-Su Yoon, Suwon si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 455 days.

(21) Appl. No.: 10/714,937

(22) Filed: Nov. 18, 2003

(65) Prior Publication Data

US 2004/0097201 A1 May 20, 2004

(30) Foreign Application Priority Data

Nov. 18, 2002 (KR) .................... 10-2002-0071737

(51) Int. Cl.
*H04B 1/02* (2006.01)
(52) U.S. Cl. .................. 455/108; 475/127.3; 375/146; 330/136
(58) Field of Classification Search ................ 455/103, 455/127.1, 127.3, 132, 205, 207, 336, 339, 455/341; 330/129, 136, 151; 375/140, 146, 375/147
See application file for complete search history.

(56) References Cited

U.S. PATENT DOCUMENTS

| | | | |
|---|---|---|---|
| 4,138,049 A | | 2/1979 | McAlarney |
| 5,867,064 A | * | 2/1999 | Van Horn et al. .......... 330/149 |
| 6,034,573 A | * | 3/2000 | Alderton ...................... 332/125 |
| 6,097,252 A | | 8/2000 | Sigmon et al. ............. 330/136 |
| 6,211,733 B1 | * | 4/2001 | Gentzler ...................... 330/149 |
| 6,242,975 B1 | * | 6/2001 | Eidson et al. ........... 330/124 R |
| 6,314,146 B1 | | 11/2001 | Tellado et al. |

(Continued)

OTHER PUBLICATIONS

Raab, Frederick H., "Efficiency of Doherty RF Power-Amplifier Systems", *IEEE Transactions on Broadcasting*, vol. BC-33, No. 3, pp. 77-83 ( Sep. 1987).

(Continued)

*Primary Examiner*—Edward F. Urban
*Assistant Examiner*—Nhan T. Le
(74) *Attorney, Agent, or Firm*—Roylance, Abrams, Berdo & Goodman, L.L.P.

(57) ABSTRACT

An apparatus and method for improving the efficiency of a power amplifier operating on the basis of a signal of a large peak-to-average power ratio (PAR). A main amplification part detects envelope values of an input baseband signal, reduces a peak value of the envelope values of the baseband signal to generate a peak reduced signal, amplifies the generated peak reduced signal, and outputs a first amplified signal. An error correction amplification part amplifies an error signal indicating a difference between the baseband signal and the peak reduced signal, and outputs a second amplified signal. A summing part combines the first amplified signal from the main amplification part and the second amplified signal from the error correction amplification part, such that high amplification efficiency is produced and an amplified output signal with reduced spectral regrowth in which an error is corrected can be outputted.

20 Claims, 7 Drawing Sheets

U.S. PATENT DOCUMENTS

| | | | |
|---|---|---|---|
| 6,396,341 B1 | 5/2002 | Pehlke | 330/10 |
| 6,646,501 B1 * | 11/2003 | Wessel | 330/10 |
| 2001/0022777 A1 | 9/2001 | Bourget et al. | |
| 2002/0061068 A1 | 5/2002 | Leva et al. | |
| 2002/0153952 A1 * | 10/2002 | Louis et al. | 330/151 |
| 2003/0064737 A1 * | 4/2003 | Eriksson et al. | 455/501 |

OTHER PUBLICATIONS

Kenney, J.S. et al., "Design Considerations for Multicarrier CDMA Base Station Power Amplifiers", *Microwave Journal,* vol. 42, No. 2., pp. 76-77, 79, (Feb. 1999).

Kim, Dukhyun et al., "Clipping Noise Mitigation for OFDM by Decision-Aided Reconstruction", *IEEE Service Center,* vol. 3, No. 1, pp. 4-6 (Jan. 1999).

* cited by examiner

APPARATUS AND METHOD FOR IMPROVING EFFICIENCY OF POWER AMPLIFIER OPERATING UNDER LARGE PEAK-TO-AVERAGE POWER RATIO

PRIORITY

This application claims priority to an application entitled "APPARATUS AND METHOD FOR IMPROVING EFFICIENCY OF POWER AMPLIFIER OPERATING UNDER LARGE PEAK-TO-AVERAGE POWER RATIO", filed in the Korean Intellectual Property Office on Nov. 18, 2002 and assigned Serial No. 2002-71737, the contents of which are hereby incorporated herein by reference.

BACKGROUND OF THE INVENTION

1. Field of the Invention

The present invention relates to a power amplifier, and more particularly to an apparatus and method for improving the efficiency of a power amplifier operating on the basis of a signal with a large peak-to-average power ratio (PAR).

2. Description of the Related Art

In conventional wireless communication systems such as cellular systems, a base station uses a power amplifier to communicate with user terminals distributed within a predetermined service area. The power amplifier amplifies a radio frequency (RF) signal for use in a communication system to transmit multiple signals and then outputs the amplified RF signal.

In particular, a cellular system using code division multiple access (CDMA) or orthogonal frequency division multiplexing (OFDM) technologies must transmit multiple modulated signals with a large peak-to-average power ratio (PAR) to multiple users connected thereto sharing the same frequency band. Because an existing power amplifier used to amplify an RF signal in this communication system must amplify all signals with large PAR and output the amplified signals, a significant amount of direct current (DC) power is consumed, resulting in an inefficient power amplifier, and increased manufacturing cost.

In order for the power amplifier operating under a large PAR signal to reduce average power loss, a peak reduction technique capable of typically reducing a signal peak value is used. This technique is described in "Clipping Noise Mitigation for OFDM by Decision-Aided Reconstruction", by Kim et al., *IEEE Communications Letters*, Vol. 3, No. 1, January 1999 and in "Design Considerations for Multicarrier CDMA Base Station Power Amplifiers", by J. S. Kenney et al., *Microwave Journal*, Vol. 42, No. 2, February 1999, both of which are incorporated herein by reference.

FIG. 1 is a block diagram illustrating an apparatus for improving the efficiency of a power amplifier using a conventional peak reduction technique.

The conventional peak reduction technique will now be described with reference to FIG. 1. When a signal with a large peak-to-average power ratio (PAR) is inputted from a baseband source signal generator (BSG) 110 to a peak reduced signal generator (PSG) 120, the PSG 120 detects a peak signal with an envelope value of a predetermined level or more from the inputted signal, reduces the level of the detected peak signal, and outputs a signal whose PAR is reduced. A peak reduced signal outputted from the PSG 120 is combined with a local oscillation signal from an RF local oscillator (RFLO) 135 by a quadrature modulator (QM) 130, such that a quadrature modulated RF signal is produced. An RF power amplifier (RFPA) 140 amplifies an output of the QM 130 and transfers the amplified output to an antenna.

The life span of a power amplifier can be improved as the PAR of a signal is reduced via the peak reduction technique. However, the peak reduction technique has problems in that a signal error rate and spectral regrowth become gradually higher as the signal's PAR is reduced, such that signal characteristics can be deteriorated thereby decreasing transmission efficiency. In other words, when the peak reduction technique is used, the improvement of the power amplifier efficiency is limited. Thus, a need exists for technology capable of effectively improving the efficiency of a power amplifier without increasing the signal error rate.

SUMMARY OF THE INVENTION

The present invention overcomes the above problems. It is an object of the present invention to provide an apparatus and method for improving the efficiency of a power amplifier, which can amplify a baseband signal with a large peak-to-average power ratio (PAR).

It is another object of the present invention to provide an apparatus and method for improving the efficiency of a power amplifier while reducing its average power loss.

It is another object of the present invention to provide an apparatus and method for improving the efficiency of a power amplifier without increasing the signal error rate incurred by the power amplifier.

It is yet another object of the present invention to provide an apparatus and method for extracting an error signal from an input signal of a power amplifier and performing an amplification operation by means of another power amplifier.

In accordance with one aspect of the present invention, the above and other objects can be accomplished by the provision of a power amplification apparatus for amplifying a baseband signal with a peak-to-average power ratio (PAR), comprising:

a main amplification part for detecting envelope values of an input baseband signal, a peak signal having an envelope value more than a predetermined value to a signal having the predetermined value or less, and amplifying the reduced signal;

an error correction amplification part for amplifying an error signal indicating a difference between the baseband signal and the reduced signal; and a summing part for combining the amplified reduced signal and the amplified error signal.

In accordance with another aspect of the present invention, the above and other objects can be accomplished by the provision of a method for improving the efficiency of a power amplifier amplifying a baseband signal with a peak-to-average power ratio (PAR), comprising the steps of:

(a) detecting an envelope values of an input baseband signal, a peak signal having an envelope value more than a predetermined value to a signal having the predetermined value or less, and amplifying the reduced signal;

(b) amplifying an error signal indicating a difference between the baseband signal and the reduced signal; and (c) combining the amplified reduced signal and the amplified error signal.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Now, preferred embodiments of the present invention will be described in detail with reference to the annexed drawings.

In accordance with the present invention, a peak signal is detected from a baseband signal with a large peak-to-average power ratio (PAR) by means of a power amplifier that amplifies a radio frequency (RF) signal. Individual power amplifiers amplify the detected peak signal and a resulting signal reduced by the peak signal, respectively, and then the amplified signals are combined. For these operations, components for detecting the peak signal and components for amplifying the peak signal will now be described.

Figure 1:
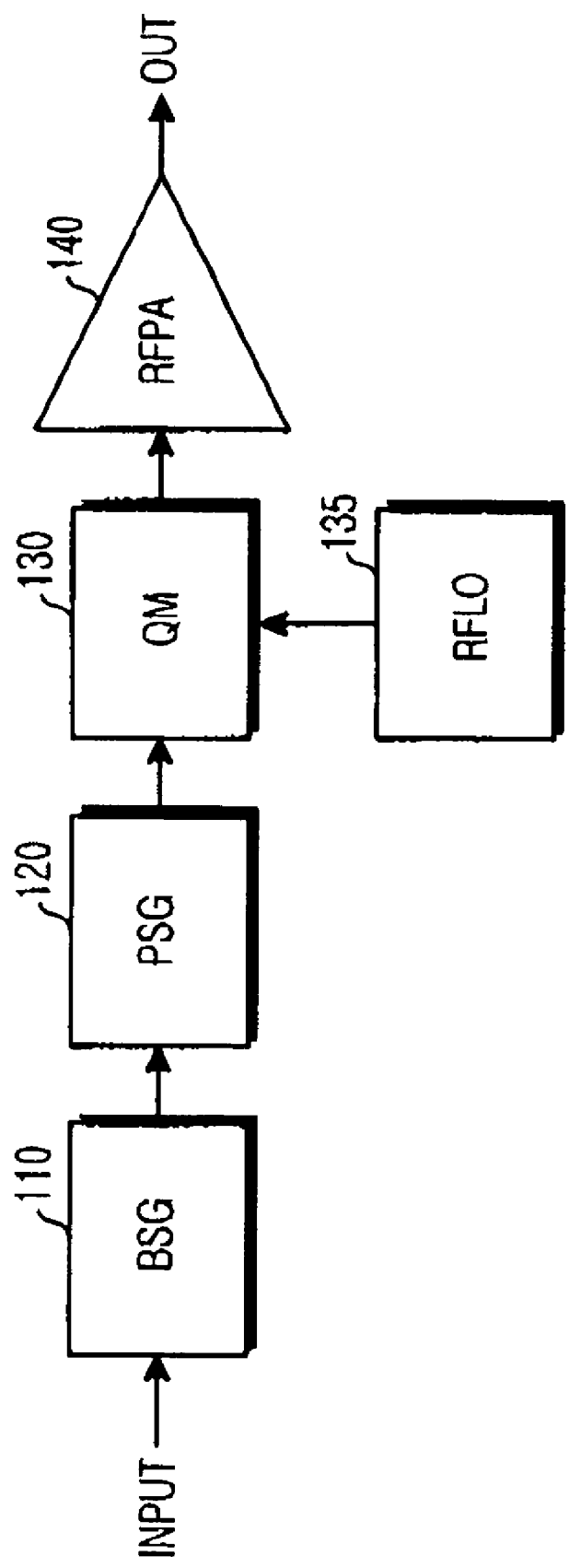
FIG. 1 is a block diagram illustrating an apparatus for improving the efficiency of a power amplifier using a conventional peak reduction technique.
Figure 2:
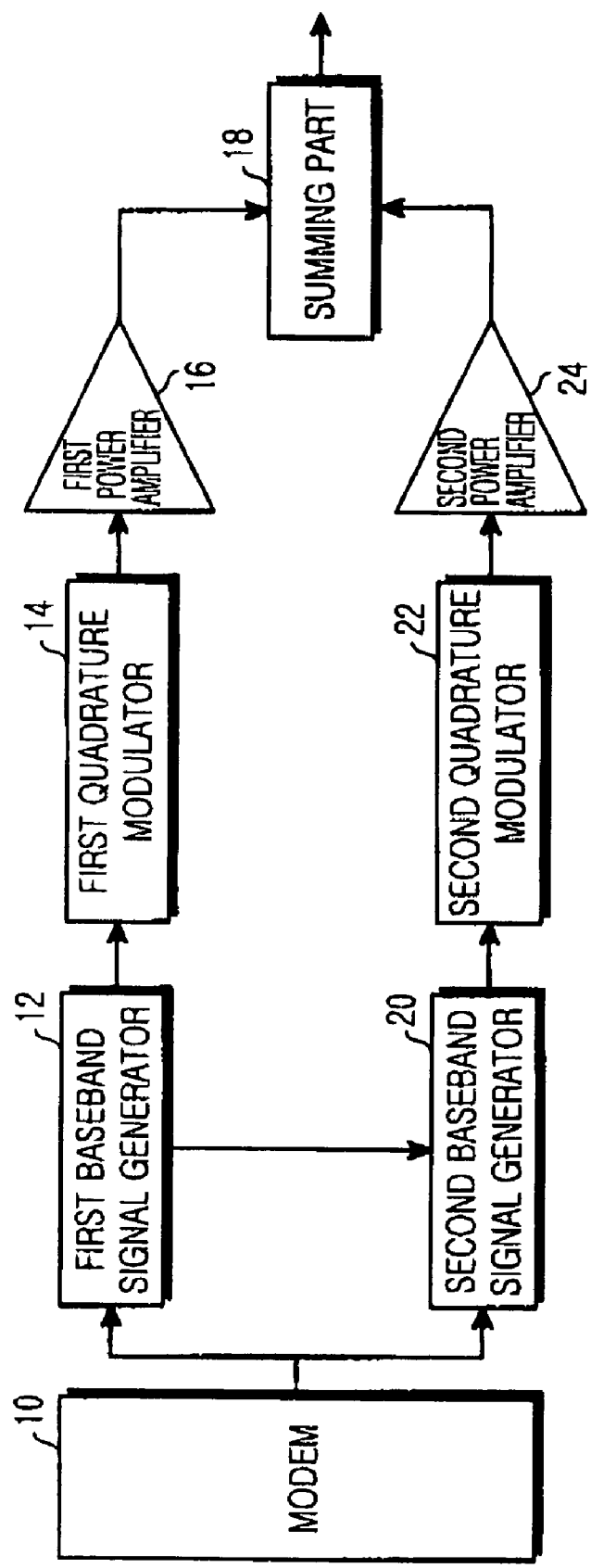
FIG. 2 is a schematic block diagram illustrating an apparatus for improving the efficiency of a power amplifier in accordance with one embodiment of the present invention.

FIG. 2 is a schematic block diagram illustrating an apparatus for improving the efficiency of a power amplifier in accordance with one embodiment of the present invention. As shown in FIG. 2, the apparatus in accordance with the present invention comprises a modem 10, a first baseband signal generator 12, a second baseband signal generator 20, a first quadrature modulator 14, a second quadrature modulator 22, a first power amplifier 16, a second power amplifier 24, and a summing part 18.

Referring to FIG. 2, the modem 10 generates a baseband source signal BS with a large peak-to-average power ratio (PAR). The first baseband signal generator 12 detects envelop values of the baseband source signal BS and reduces a peak value of the envelop values to generate a peak reduced signal. The first quadrature modulator 14 modulates the peak reduced signal PRS and up-converts the modulated peak reduced signal PRS in the RF band. The first power amplifier 16 amplifies a signal outputted from the first quadrature modulator 14 and transmits a first amplified signal to the summing part 18.

The second baseband signal generator 20 generates an error signal by subtracting the peak reduced signal from the baseband source signal BS. The second quadrature modulator 22 modulates the error signal and up-converts the modulated error signal PRS in the RF band. The second power amplifier 24 amplifies a signal outputted from the second quadrature modulator 22 and transmits a second amplified signal to the summing part 18.

Finally, the summing part 18 combines the first amplified signal from the first power amplifier 16 and the second amplified signal from the second power amplifier 24 and transmits the combined signal to an antenna.

Figure 3:
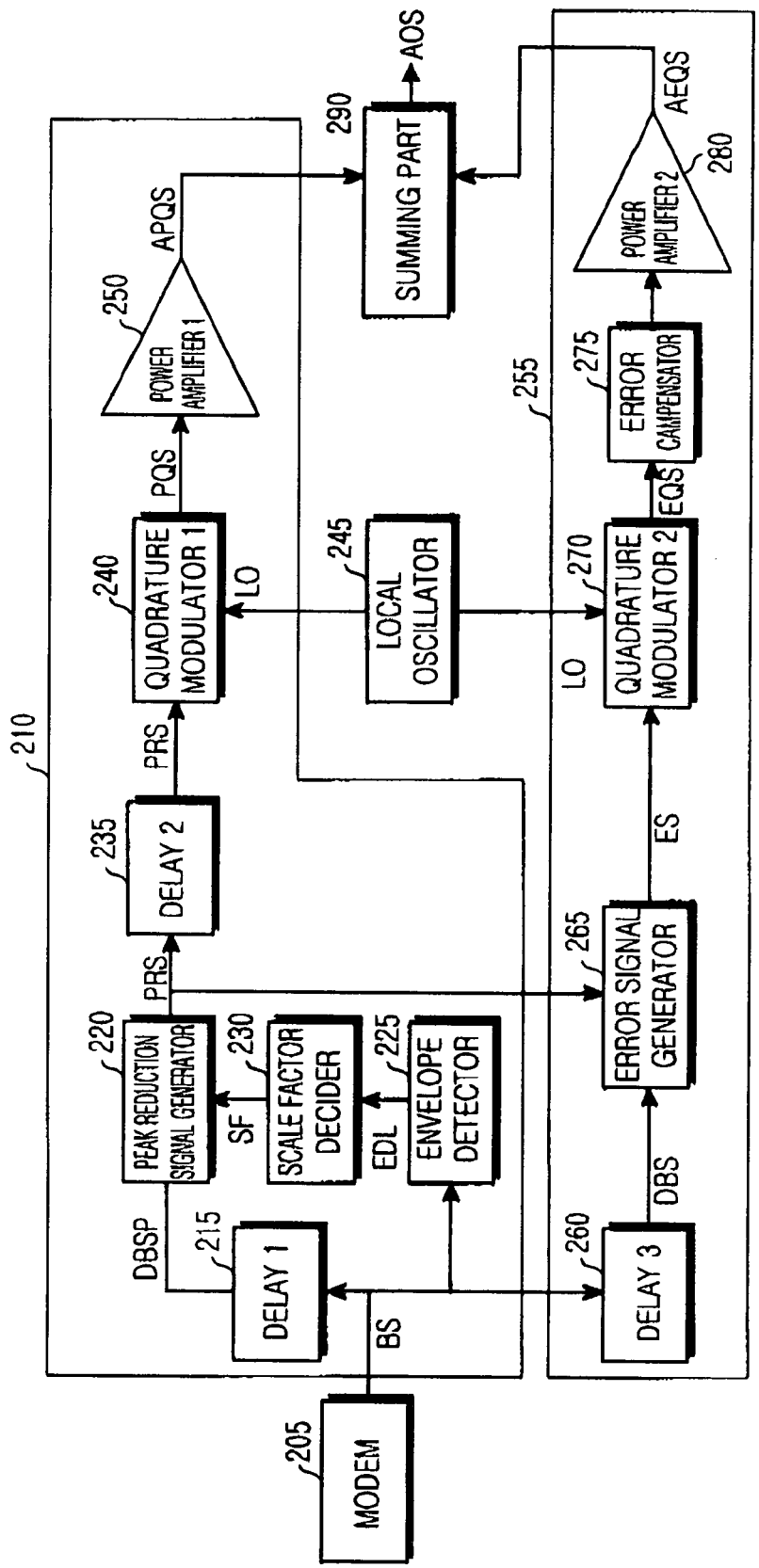
FIG. 3 is a block diagram illustrating an apparatus for improving the efficiency of the power amplifier in accordance with one embodiment of the present invention.

FIG. 3 is a block diagram illustrating an apparatus for improving the efficiency of a power amplifier in accordance with one embodiment of the present invention. Here, elements 215, 220, 225, 230, and 235 are corresponding to the first baseband signal generator 12 of FIG. 2, elements 260 and 265 are corresponding to the second baseband signal generator 20 of FIG. 2. Hereinafter, however, the first baseband signal generator 12 and the second baseband signal generator 20 will be referred to as a main amplification part 210 of a baseband source signal and an error correction amplification part 255, respectively.

Referring to FIG. 3, the apparatus in accordance with the present invention comprises a modem 205, a main amplification part 210, an error correction amplification part 255 and a summing part (SUM) 290. The modem 205 generates a baseband source signal BS with a large peak-to-average power ratio (PAR). The main amplification part 210 detects envelope values of the baseband source signal BS, generates a peak reduced signal PRS by reducing at least one peak value of the envelope values, and amplifies the peak reduced signal PRS in a radio frequency (RF) band. The error correction amplification part 255 amplifies an error signal ES indicating a difference between the baseband source signal BS and the peak reduced signal PRS in the RF band. The SUM 290 combines the amplified signal from the main amplification part 210 and the amplified signal from the error correction amplification part 255.

In the main amplification part 210, a Quadrature Modulator 1 (that is, a peak reduced signal quadrature modulator hereinafter referred to as PQM) 240 up-converts the peak reduced signal PRS in the RF band and combines the up-converted peak reduced signal with a local oscillation signal LO from an RF local oscillator (RFLO) 245, thereby producing a peak reduction quadrature modulated signal PQS. A Power Amplifier 1 (that is, RF power amplifier, hereinafter referred to as RFPA) 250 amplifies the peak reduction quadrature modulated signal PQS to output an amplified PQS (APQS).

In the error correction amplification part 255, a Quadrature Modulator 2 (that is, an error signal quadrature modulator hereinafter referred to as EQM) 270 up-converts the error signal ES in the RF band, and combines the up-converted error signal with the local oscillation signal LO from the RFLO 245, thereby producing the error quadrature modulated signal EQS.

An Error Compensator (that is, an error quadrature modulated signal compensator hereinafter referred to as EQC) 275 compensates for amplitude, phase and delay of the error quadrature modulated signal EQS, and provides a result of the compensation to a Power Amplifier 2 (that is, an RF error correction amplifier hereinafter referred to as RFEA) 280 so that the amplified signal from the main amplification part 210 and the amplified signal from the error correction amplification part 255 can be appropriately combined. The RFEA 280 amplifies the error quadrature modulated signal EQS compensated by the EQC 275 to output an amplified EQS (AEQS).

The SUM 290 combines the first amplified signal APQS and the second amplified signal AEQS to finally output an amplified output signal AOS. In a CDMA communication system, the amplified output signal AOS is transmitted to an antenna through a transmission filter for filtering a radio frequency band requested by each user. In a TDMA or FDMA communication system, the amplified output signal AOS is transmitted to the antenna through filtering of a corresponding frequency band, as well.

The operation for producing the peak reduced signal PRS in the main amplification part 210 will now be described. An envelope detector (ED) 225 detects a signal envelope detection level (EDL) of the baseband source signal BS. A scale factor decider (SFD) 230 decides a scale factor (SF) for reducing at least one peak value of the baseband signal using the signal EDL detected by the ED 225. The SF indicates a reduction ratio for reducing the peak value. It is preferable that the SF is decided so that the spectral regrowth of the peak reduced signal PRS and error signal ES can be minimized. The SF is obtained by known peak reduction methods.

Figure 4A:
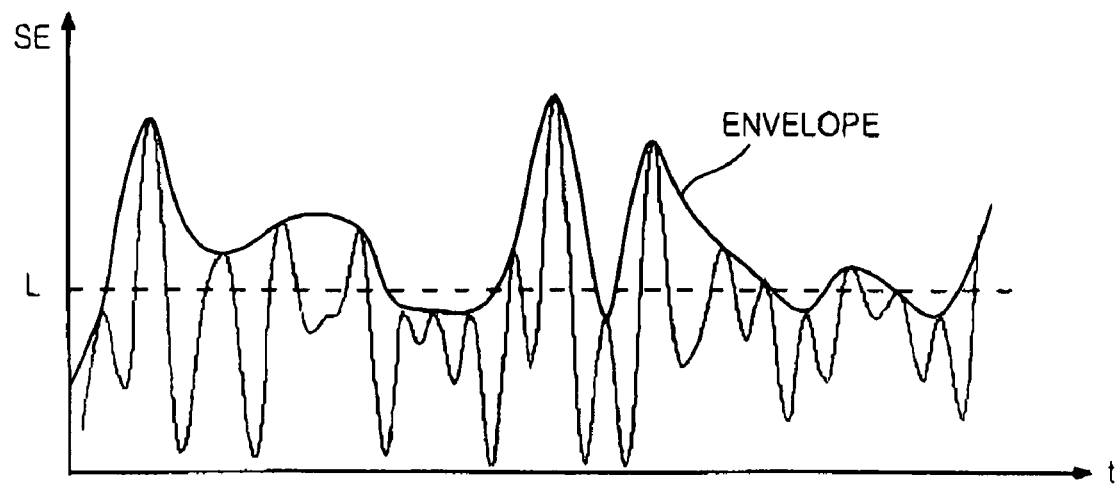
FIGS. 4A to 4C are graphs illustrating peak reduced signals produced by the apparatus shown in FIG. 2 in accordance with the present invention.
Figure 4B:
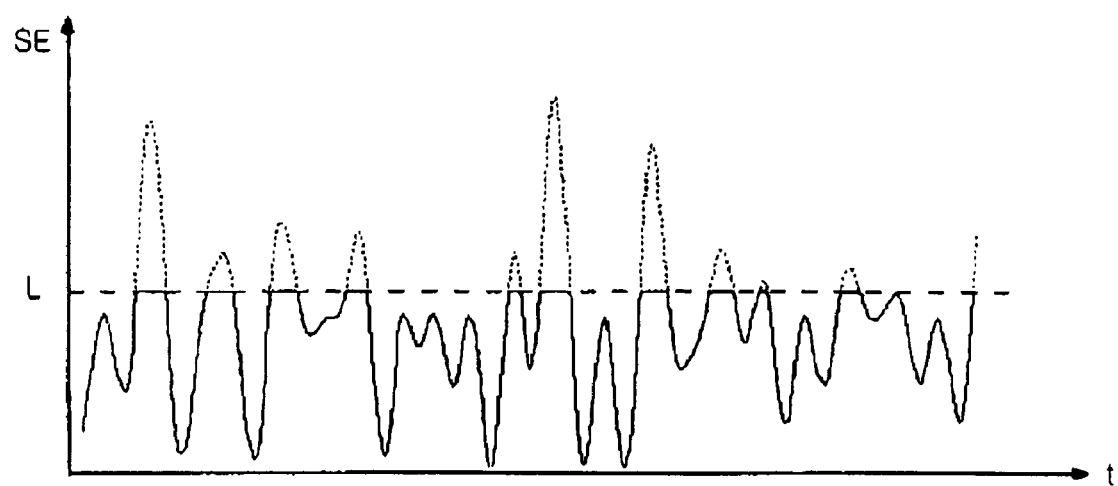
Figure 4C:
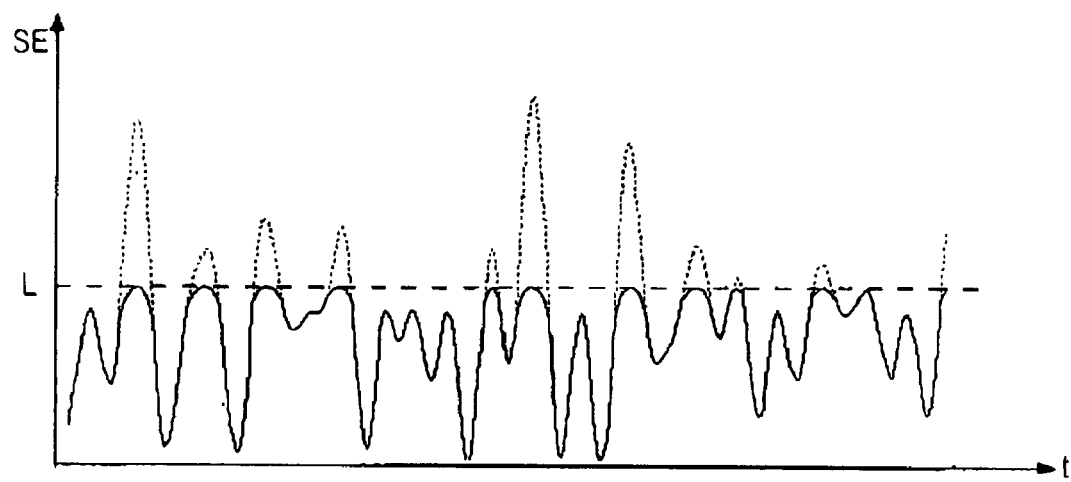

The peak reduction methods are classified into hard clipping and soft clipping according to a form of reducing the peak value. Where a large PAR signal with a signal envelope SE shown in FIG. 4A is inputted, a signal with the signal envelope SE of a predetermined value L or below is bypassed, and a signal with the signal envelope SE of above the predetermined value L is clipped, in accordance with the hard clipping shown in FIG. 4B. On the other hand, in accordance with the soft clipping shown in FIG. 4C, a signal with the signal envelope SE of the predetermined value L or below is bypassed, and a signal with the signal envelope SE of above the predetermined value L is clipped by an amount of clipping varying with a signal level. The hard clipping can be simply implemented. However, since the spectral regrowth of the inputted signal increases in the hard clipping, it is preferable that the peak signal is clipped using the soft clipping.

A Delay device 1 (that is, a BS delay for PSG hereinafter referred to as BSDP) 215 delays the baseband source signal BS by a predetermined time and outputs a delayed BS for PSG (DBSP) so that a time difference between the baseband source signal BS and the scale factor SF associated with the ED 225 and the SFD 230 can be compensated.

A peak reduction signal generator (PSG) 220 reduces a peak value of the delayed BS for PSG (DBSP) according to the scale factor SF, thereby generating the peak reduced signal PRS. The peak reduced signal PRS is produced by multiplying the delayed BS for PSG (DBSP) by the scale factor SF. Before the peak reduced signal PRS is inputted into the PQM 240, a Delay device 2 (that is, a PRS delay hereinafter referred to as PRSD) 235 delays the peak reduced signal PRS by a predetermined time so that a time difference between the peak reduced signal PRS and the error signal ES associated with an error signal generator (ESG) 265 can be compensated.

The components for producing the error signal ES provided in the error correction amplification part 255 will now be described. First, a Delay device 3 (that is, a BS delay for ESG hereinafter referred to as BSDE) 260 delays the baseband source signal BS by a predetermined time so that a time difference between the baseband source signal BS and the peak reduced signal PRS associated with the PSG 220 can be compensated. The ESG 265 subtracts the peak reduced signal PRS outputted by the PSG 220 from a delayed BS for ESG (DBSE) outputted by the BSDE device 260, thereby generating the error signal ES. The ESG 265 outputs the error signal ES to the EQM 270.

Figure 5A:
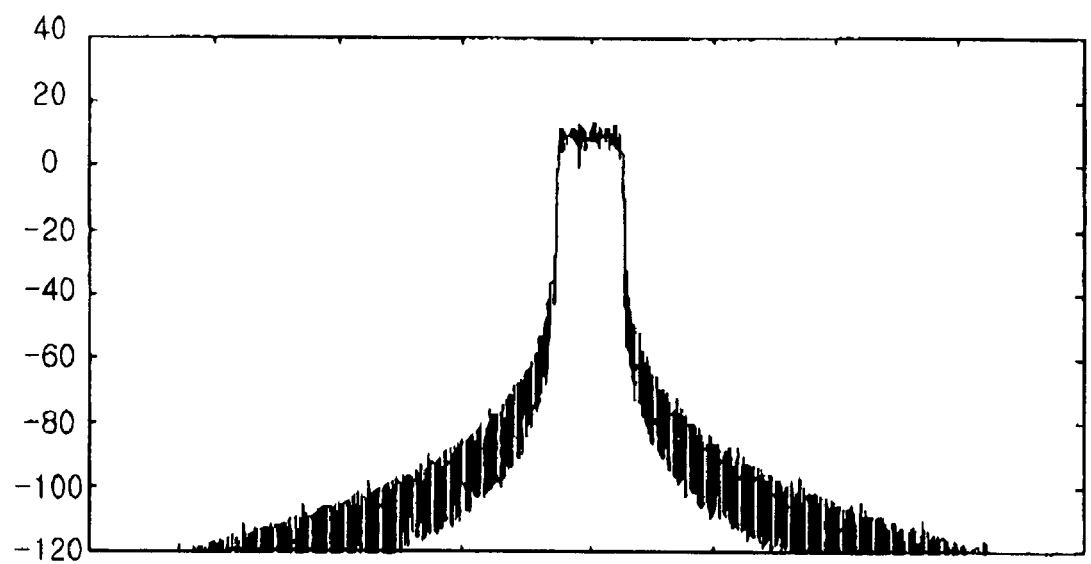
FIGS. 5A to 5C are graphs illustrating frequency response characteristics of the peak reduced signals produced by the apparatus shown in FIG. 2 in accordance with the present invention.
Figure 5B:
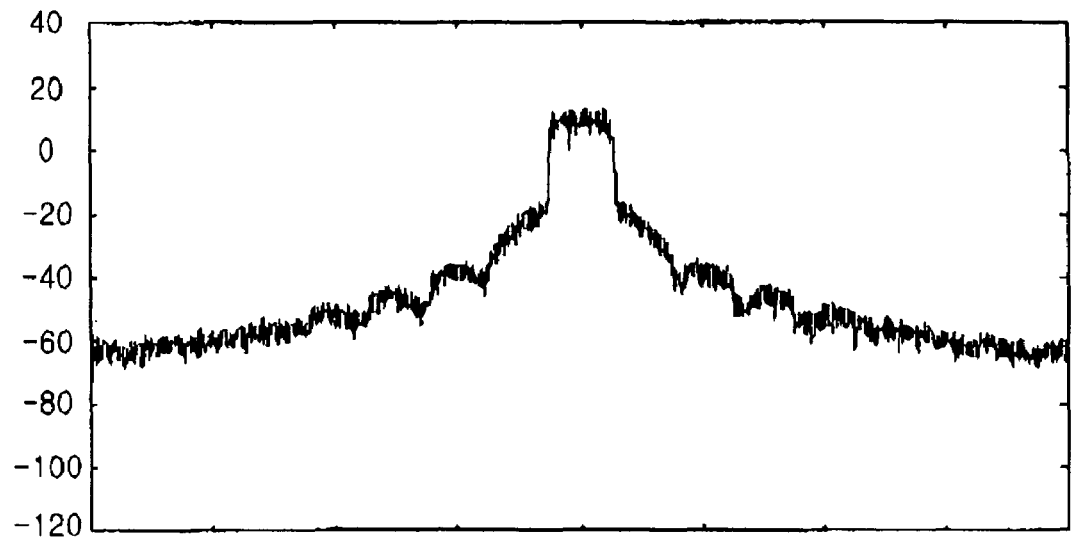
Figure 5C:
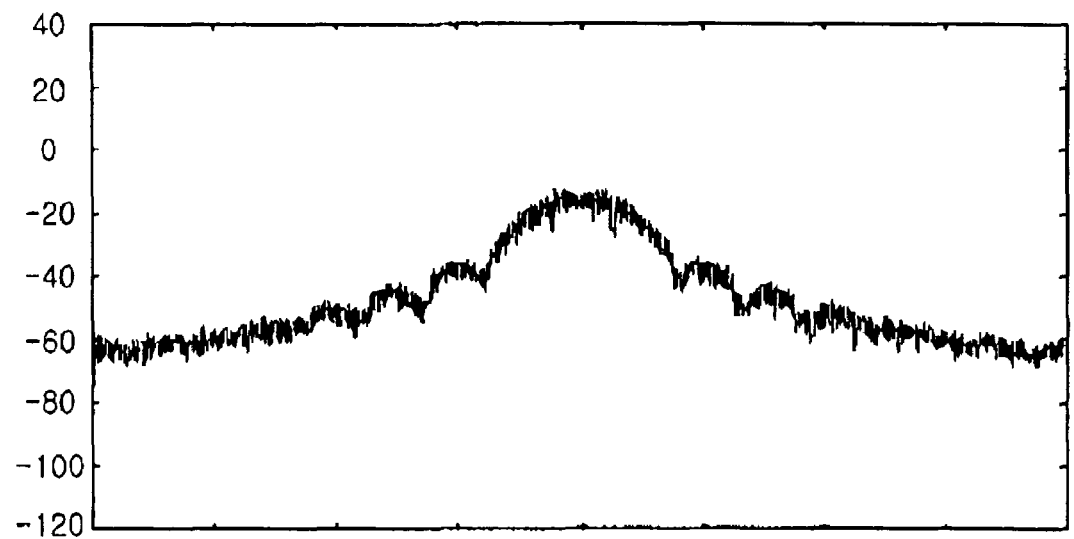
Figure 6:
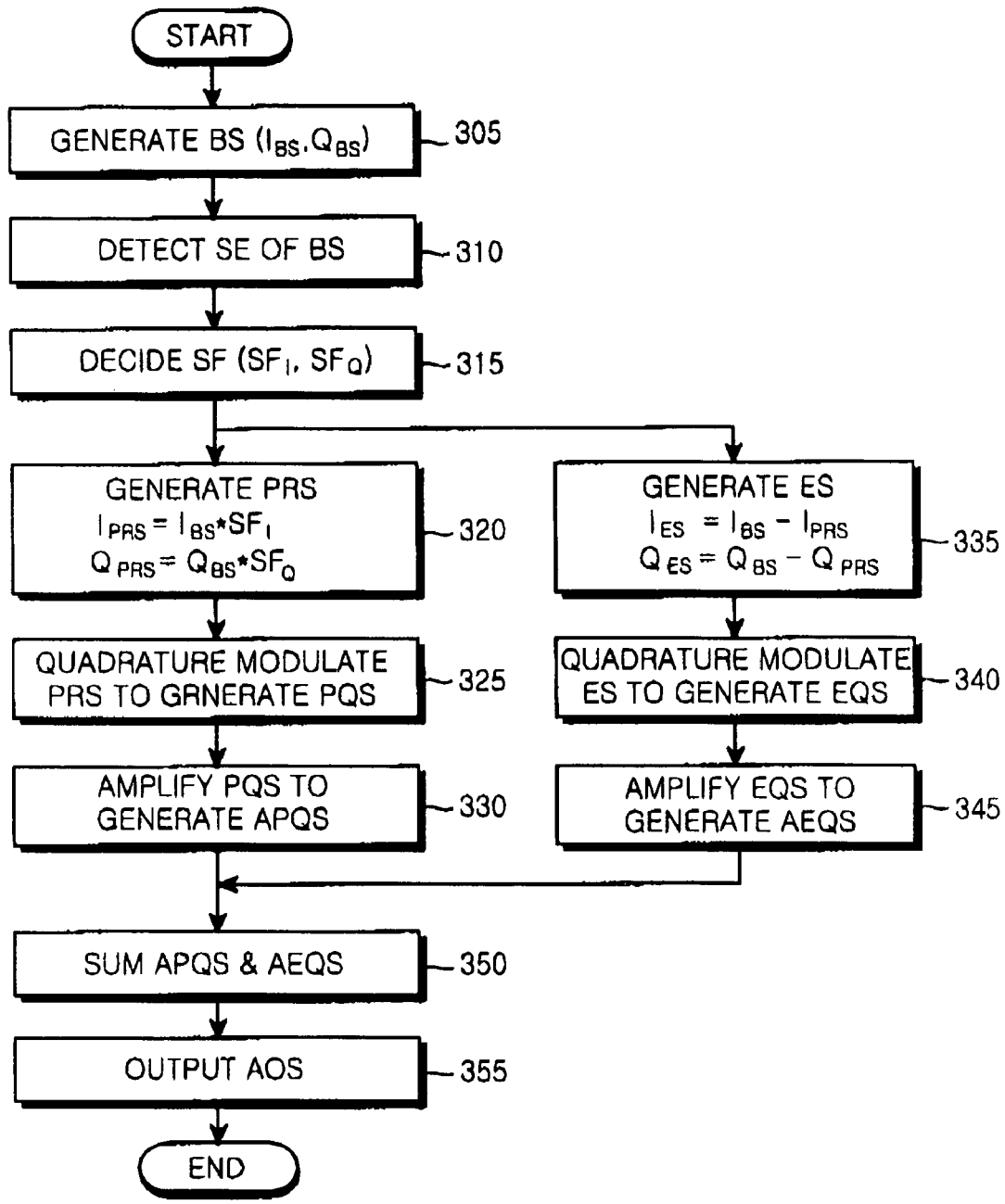
FIG. 6 is a flow chart illustrating a method for improving the efficiency of the power amplifier in accordance with the present invention.

FIGS. 5A to 5C are graphs illustrating frequency response characteristics of the peak reduced signals produced by the apparatus shown in FIG. 3 in accordance with the present invention; and FIG. 6 is a flow chart illustrating a method for improving the efficiency of the power amplifier in accordance with the present invention.

Referring to FIG. 6, at step 305, the BSG 205 inputs a baseband source signal BS consisting of an in-phase component $I_{BS}$ and a quadrature component $Q_{BS}$ into the ED 225, the BSDP device 215 and the BSDE device 260. FIG. 5A indicates the frequency response characteristic of the baseband source signal BS. As shown in FIG. 5A, it can be seen that peak power is very high in comparison with average power.

At step 310, the ED 225 obtains a signal envelope SE of the baseband source signal BS, determines whether the obtained signal envelope SE is above a predetermined reference value L, and detects a difference between the obtained signal envelope SE and the predetermined reference value L if the obtained signal envelop SE is above the predetermined reference value L.

If the obtained signal envelop SE is of the predetermined reference value L or below, it is not necessary to clip a peak signal of the baseband source signal BS. However, if the obtained signal envelop SE is above the predetermined reference value L, the SFD 230 decides a scale factor SF according to the difference between the obtained signal envelope SE and the predetermined reference value L at step 315 so that an error rate and spectral regrowth can be minimized when the baseband source signal BS is clipped by the difference. The scale factor SF consists of a scale factor $SF_1$ for the in-phase component $I_{BS}$ and a scale factor $SF_Q$ for the quadrature component $Q_{BS}$.

At step 320, the PSG 220 multiplies a delayed BS for PSG (DBSP) outputted by the BSDP device 215 by the scale factor SF, thereby generating a peak reduced signal PRS. FIG. 5B indicates the frequency response characteristic of the peak reduced signal PRS. The PAR of the peak reduced signal PRS shown in FIG. 5B is significantly smaller in comparison with the PAR of the baseband source signal BS shown in FIG. 5A.

The BSDP device 215 delays the baseband source signal BS and generates the delayed BS for PSG (DBSP) so that the DBSP and the scale factor SF can be synchronized with each other.

The peak reduced signal PRS generated from the PSG 220 is inputted into the PQM 240 through the PRSD device 235. At step 325, the PQM 240 combines a delayed peak reduced signal DPRS from the PRSD device 235 with the local oscillation signal LO from the RFLO 245, such that the peak reduction quadrature modulated signal PQS is produced according to an up-conversion operation in an RF domain. At step 330, the RFPA 250 amplifies the peak reduction quadrature modulated signal PQS so that an amplified PQS (APQS) can be produced.

At step 335, the ESG 265 subtracts the peak reduced signal PRS from a delayed BS for ESG (DBSE) outputted by the BSDE device 260, thereby generating an error signal ES. The error signal SE indicates a peak signal of the baseband source signal BS, and its frequency response characteristic is shown in FIG. 5C. A signal shown in FIG. 5C indicates a difference signal between the signal shown in FIG. 5A and the signal shown in FIG. 5B.

The BSDE device 260 delays the baseband source signal BS and generates the delayed BS for ESG (DBSE) so that the DBSE and the peak reduced signal PRS can be synchronized with each other.

The error signal ES generated from the ESG 265 is inputted into the EQM 270. At step 340, the EQM 270 combines the error signal ES and a local oscillation signal LO from the RFLO 245, such that the error quadrature modulated signal EQS is produced according to an upconversion operation in an RF band. At step 345, the error quadrature modulated signal EQS is compensated by the EQC 275 and is amplified by the RFEA 280, such that the amplified EQS (AEQS) is outputted. The EQC 275 compensates for amplitude, phase and delay of the error quadrature modulated signal EQS while taking into account amplification characteristics of the RFPA 250 and the RFEA 280, and provides a result of the compensation to the RFEA 280.

At step 350, the SUM 290 combines the amplified PQS (APQS) from the RFPA 250 and the amplified EQS (AEQS) from the RFEA 280. At step 355, the SUM 290 outputs an amplified output signal AOS as a result of the combining. According to the combining, a part clipped by the PSG 220 can be compensated, and also an error and spectral regrowth in the amplified PQS (APQS) can be eliminated.

The efficiency of the RFPA 250 shown in FIG. 3 can be improved as an input signal with a large PAR is converted into a signal with a small PAR using the peak reduction technique. In this case, the error rate and spectral regrowth associated with the signal outputted from the RFPA 250 significantly increase. In accordance with the present invention, a compensation operation is carried out with respect to the increased error rate and spectral regrowth associated with an output signal of the RFPA 250 using an output signal of the RFEA 280. Consequently, the efficiency of the power amplifier is improved, while the error rate and spectral regrowth are reduced. A factor for deciding the efficiency of the RFPA 250 is a PAR of the peak reduced signal PRS, and a factor for deciding the capacity of the RFPA 250 is spectral regrowth of the peak reduced signal PRS, i.e., amplitude of the error signal ES.

In order for the efficiency to be optimally improved, the PAR and spectral regrowth all must be small in the characteristic required in the peak reduced signal PRS. Where the peak reduced signal PRS as in the hard clipping shown in FIG. 3B is obtained, a PAR of the peak reduction quadrature modulated signal PQS generated from the peak reduced signal PRS is reduced and hence the efficiency of the RFPA 250 is improved. However, the spectral regrowth deteriorates, resulting in increasing the necessary capacity of the RFEA 280. Since this adversely affects the efficiency of the overall system, the PAR and spectral regrowth of the peak reduced signal PRS must all be small so that the efficiency of the overall system can be optimally improved.

Advantageous effects of the present invention will now be briefly described.

As apparent from the above description, the present invention provides an apparatus and method, which can implement a highly efficient and cost effective power amplifier. In other words, the apparatus and method in accordance with the present invention can reduce a peak-to-average power ratio (PAR) of an input signal in a power amplifier provided in a mobile communication base station and improve the efficiency of the power amplifier. An increased error rate and spectral regrowth due to the reduced PAR are eliminated by error correction technology, such that the efficiency of the power amplifier can be improved and its manufacturing cost can be reduced.

Although the preferred embodiments of the present invention have been disclosed for illustrative purposes, those skilled in the art will appreciate that various modifications, additions and substitutions are possible, without departing from the scope of the invention. Therefore, the present invention is not limited to the above-described embodiments, but the present invention is defined by the claims which follow, along with their full scope of equivalents.

What is claimed is:

1. A power amplification apparatus for amplifying a baseband signal with a peak-to-average power ratio (PAR), comprising:
    a main amplification part comprising an envelop detector, a scale factor decider and a peak reduced signal generator for detecting envelope values of an input baseband signal, and deciding a scale factor for clipping the baseband signal by a difference between the detected envelop signal and a predetermined reference value, reducing a peak signal having an envelope value more than a predetermined value to a signal having the predetermined value or less by multiplying the baseband signal by the scale factor, and amplifying the reduced signal;
    an error correction amplification part for amplifying an error signal indicating a difference between the baseband signal and the reduced signal; and
    a summing part for combining the amplified reduced signal and the amplified error signal.

2. The power amplification apparatus as set forth in claim 1, wherein the main amplification part further comprises:
    a quadrature modulator for modulating the reduced signal; and
    a power amplifier for amplifying the quadrature modulated signal.

3. The power amplification apparatus as set forth in claim 1, wherein the main amplification part further comprises:
    a delay device for delaying the baseband signal and providing the delayed baseband signal to the peak reduced signal generator.

4. The power amplification apparatus as set forth in claim 1, wherein the main amplification part further comprises:
    a delay device for delaying the peak reduced signal by a predetermined time and providing the delayed peak reduced signal to the quadrature modulator.

5. The power amplification apparatus as set forth in claim 1, wherein the error correction amplification part further comprises:
    a quadrature modulator for modulating the error signal; and
    a power amplifier for amplifying the modulated signal.

6. The power amplification apparatus as set forth in claim 1, wherein the error correction amplification part further comprises:
    an error compensator for compensating for amplitude, phase and delay of the quadrature modulated error signal and providing a result of the compensation to the power amplifier.

7. The power amplification apparatus as set forth in claim 1, wherein the error correction amplification part comprises:
    an error signal generator for subtracting the reduced signal from the baseband signal to generate the error signal.

8. The power amplification apparatus as set forth in claim 7, wherein the error correction amplification part further comprises:
    a delay device for delaying the baseband signal and providing the delayed baseband signal to the error signal generator.

9. The power amplification apparatus as set forth in claim 1, wherein the predetermined value is decided so that a PAR of the baseband signal is reduced and hence an error rate and spectral regrowth due to the PAR can be minimized.

10. The power amplification apparatus as set forth in claim 1, wherein the combined signal from the summing part is filtered in a radio frequency band to be transmitted and the filtered signal is transmitted through an antenna.

11. The power amplification apparatus as set forth in claim 1, wherein the error correction amplification part comprises:
   a delay device for delaying the baseband signal;
   an error signal generator for subtracting the reduced signal from the delayed baseband signal to generate the error signal;
   a quadrature modulator for modulating the error signal and generating a quadrature modulated signal in a radio frequency band;
   an error compensator for compensating phase and delay of the quadrature modulated signal so that an amplification characteristic difference between the main amplification part and the error correction amplification part can be compensated; and
   a power amplifier for amplifying the compensated signal and outputting the second amplified signal.

12. A method for improving the efficiency of a power amplifier amplifying a baseband signal with a peak-to-average power ratio (PAR), comprising the steps of:
   (a) detecting an envelope values of an input baseband signal, clipping a peak signal having an envelope value more than a predetermined value to a reduced signal having the predetermined value or less, and amplifying the reduced signal;
   (b) amplifying an error signal indicating a difference between the baseband signal and the reduced signal; and
   (c) combining the amplified reduced signal and the amplified error signal.

13. The method amplifying the reduced signal as set forth in claim 12, wherein the step (a) further comprises the steps of:
   (a-1) modulating the reduced signal to a quadrature modulated signal; and
   (a-2) amplifying the quadrature modulated signal.

14. The method amplifying the reduced signal as set forth in claim 12, wherein the step (a) comprises the steps of:
   (a-3) detecting an envelope values from the baseband signal;
   (a-4) deciding a scale factor for clipping the baseband signal by a difference between the detected envelope values and a predetermined reference value when the detected envelope is above the predetermined reference value; and
   (a-5) multiplying the baseband signal by the scale factor and generating the reduced signal.

15. The method amplifying the error signal as set forth in claim 12, wherein the step (b) further comprises the steps of:
   (b-1) modulating the error signal; and
   (b-2) amplifying the modulated error signal.

16. The method amplifying the error signal as set forth in claim 15, wherein the step (b) further comprises the step of:
   (b-3) before the quadrature modulated signal is amplified, compensating for amplitude, phase and delay of the quadrature modulated error signal.

17. The method amplifying the error signal as set forth in claim 12, wherein the step (b) comprises the step of:
   (b-4) subtracting the reduced signal from the baseband signal to generate the error signal.

18. The method as set forth in claim 12, wherein the predetermined value is decided so that the PAR of the baseband signal is reduced and hence an error rate and spectral regrowth due to the PAR can be minimized.

19. The method combining the amplifying reduced signal and the amplifying error signal as set forth in claim 12, wherein a the combined signal is filtered in a radio frequency band to be transmitted and the filtered signal is transmitted through an antenna.

20. The method as set forth in claim 12, wherein the step (b) comprises the steps of:
   (b-1) delaying the baseband signal;
   (b-2) subtracting the reduced signal from the delayed baseband signal to generate the error signal;
   (b-3) a quadrature modulating the error signal and generating a quadrature modulated signal in a radio frequency band;
   (b-4) compensating phase and delay of the quadrature modulated signal so that an amplification characteristic difference between the step (a) and the step (b) can be compensated; and
   (b-5) amplifying the compensated signal and outputting the second amplified signal.

* * * * *